(12) United States Patent
Kim et al.

(10) Patent No.: US 7,807,513 B1
(45) Date of Patent: Oct. 5, 2010

(54) METHOD FOR MANUFACTURING SEMICONDUCTOR DEVICE

(75) Inventors: Hyung Kyun Kim, Seoul (KR); Yong Soo Joung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/647,631

(22) Filed: Dec. 28, 2009

(30) Foreign Application Priority Data

Jun. 26, 2009  (KR) ............... 10-2009-0057524

(51) Int. Cl.
*H01L 21/82* (2006.01)

(52) U.S. Cl. ............. 438/128; 438/129; 438/532; 438/599; 257/E21.585; 257/E21.658; 257/E21.66

(58) Field of Classification Search ............ 438/23, 438/532, 599; 257/E21.613, E21.662, E21.678
See application file for complete search history.

(56) References Cited

U.S. PATENT DOCUMENTS 6,326,657 B1 * 12/2001 Ohkawa ............ 257/296

* cited by examiner

*Primary Examiner*—Charles D Garber
*Assistant Examiner*—Cheung Lee
(74) *Attorney, Agent, or Firm*—Ladas & Parry LLP (57) ABSTRACT

Methods for manufacturing a semiconductor device are provided that reduces the thickness of an oxide layer formed on a polysilicon layer for bit line contacts. A reduced thickness oxide layer can prevent short circuits between adjoining bit lines. A reduced thickness oxide layer can also eliminate the need for overetching in a subsequent etching process, thereby preventing loss of an isolation layer in a peripheral region.

12 Claims, 12 Drawing Sheets

METHOD FOR MANUFACTURING SEMICONDUCTOR DEVICE

CROSS-REFERENCE TO RELATED APPLICATIONS

The present application claims priority to Korean patent application number 10-2009-0057524 filed on Jun. 26, 2009, which is incorporated herein by reference in its entirety.

BACKGROUND OF THE INVENTION

The present invention generally relates to a method for to manufacturing a semiconductor device, and more particularly, to a method for manufacturing a semiconductor device that can reduce the thickness of an oxide layer formed on a polysilicon layer for bit line contacts.

In a DRAM (dynamic random access memory) in which a is unit cell is constituted by one MOS (metal oxide semiconductor) transistor and one capacitor, it is important to have a high degree of integration in order to increase the capacitance of the capacitor that occupies a large area, and decrease the area that is occupied by the capacitor.

Therefore, in order to form a capacitor having high capacitance within a small area, attempts such as increasing the height of the capacitor or reducing the thickness of a dielectric layer have been made.

However, in the case of increasing the height of the capacitor so as to secure desired capacitance of the capacitor, problems are caused due to an increase in the depth of step portions, resulting from the increase in the height of the capacitor. Further, in the case of reducing the thickness of a dielectric layer, leakage current increases.

In order to cope with these problems, recently, a method has been proposed, in which bit line parasitic capacitance is decreased to the level of one half by using a buried type gate structure, so that the capacitance of a capacitor that is required to maintain the same performance of a sense amplifier is significantly decreased.

FIGS. 1A through 1F are cross-sectional views explaining a conventional method for manufacturing a semiconductor device.

Figure 1A:
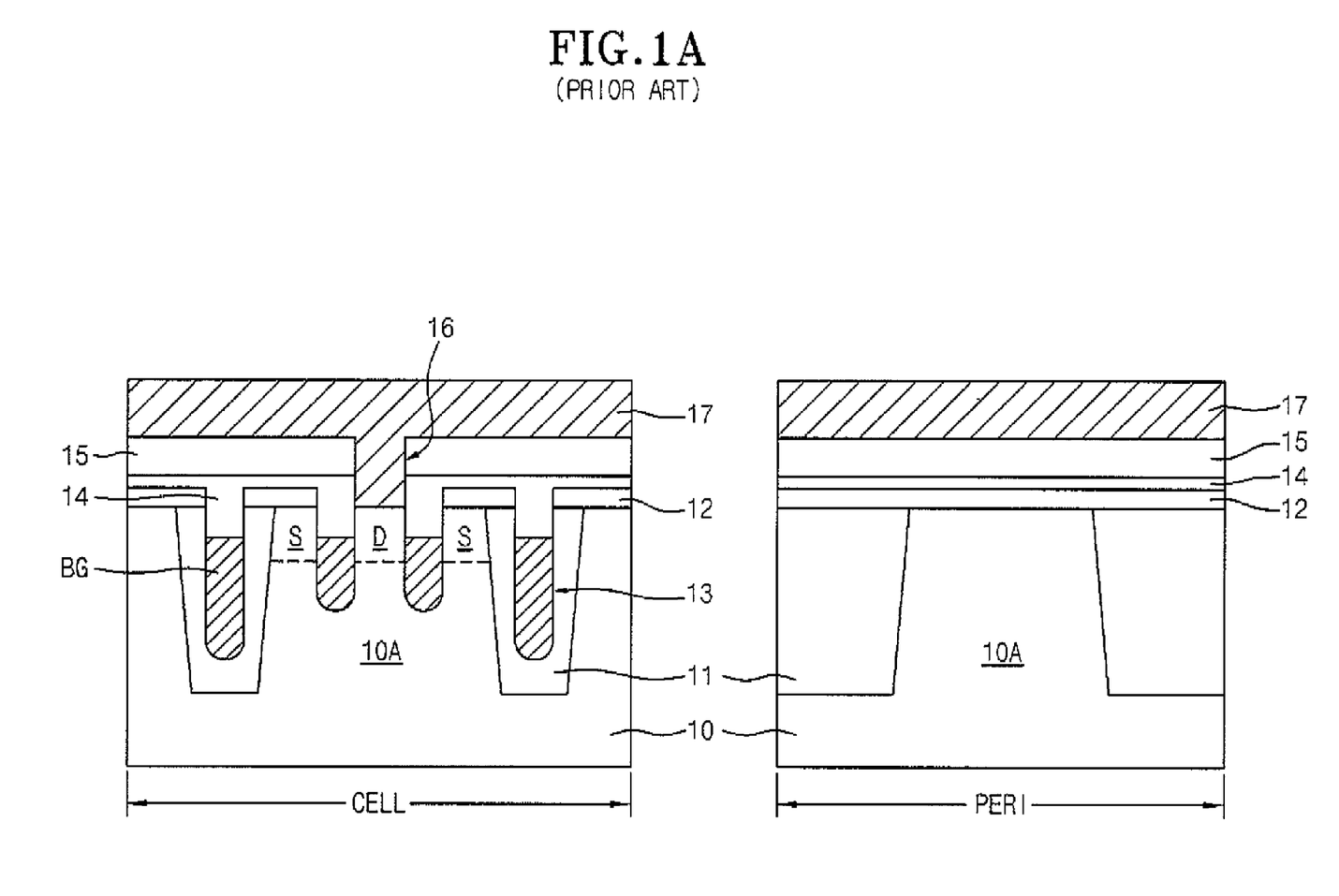
FIGS. 1A through 1F are cross-sectional views explaining a conventional method for manufacturing a semiconductor device.

Referring to FIG. 1A, after forming an isolation layer 11 in a cell region CELL and a peripheral region PERI of a substrate 10 in such a way as to delimit active regions 10A, a hard mask layer 12 is formed in the cell region CELL and the peripheral region PERI. Trenches 13 are defined by etching the hard mask layer 12, the isolation layer 11 and the substrate 10 at gate forming zones in the is cell region CELL.

Then, after forming buried type gates BG in the lower portions of the trenches 13, sources S and drains D are formed in the active regions 10A on both sides of the trenches 13. A capping layer 14 is formed in the cell region CELL and the peripheral region PERI to fill the trenches 13. An interlayer dielectric 15 is formed on the capping layer 14.

Next, bit line contact holes 16 are defined by sequentially etching the interlayer dielectric 15, the capping layer 14 and the hard mask layer 12 in the cell region CELL, in such a way as to expose the drains D. A heavily doped polysilicon layer 17 is formed on the entire surface, including the bit line contact holes 16. The polysilicon layer 17 is formed for bit line contacts to electrically connect subsequently formed bit lines and the drains D. The polysilicon layer 17 is formed as a heavily doped polysilicon layer so as to reduce the resistance of bit line contacts.

Figure 1B:
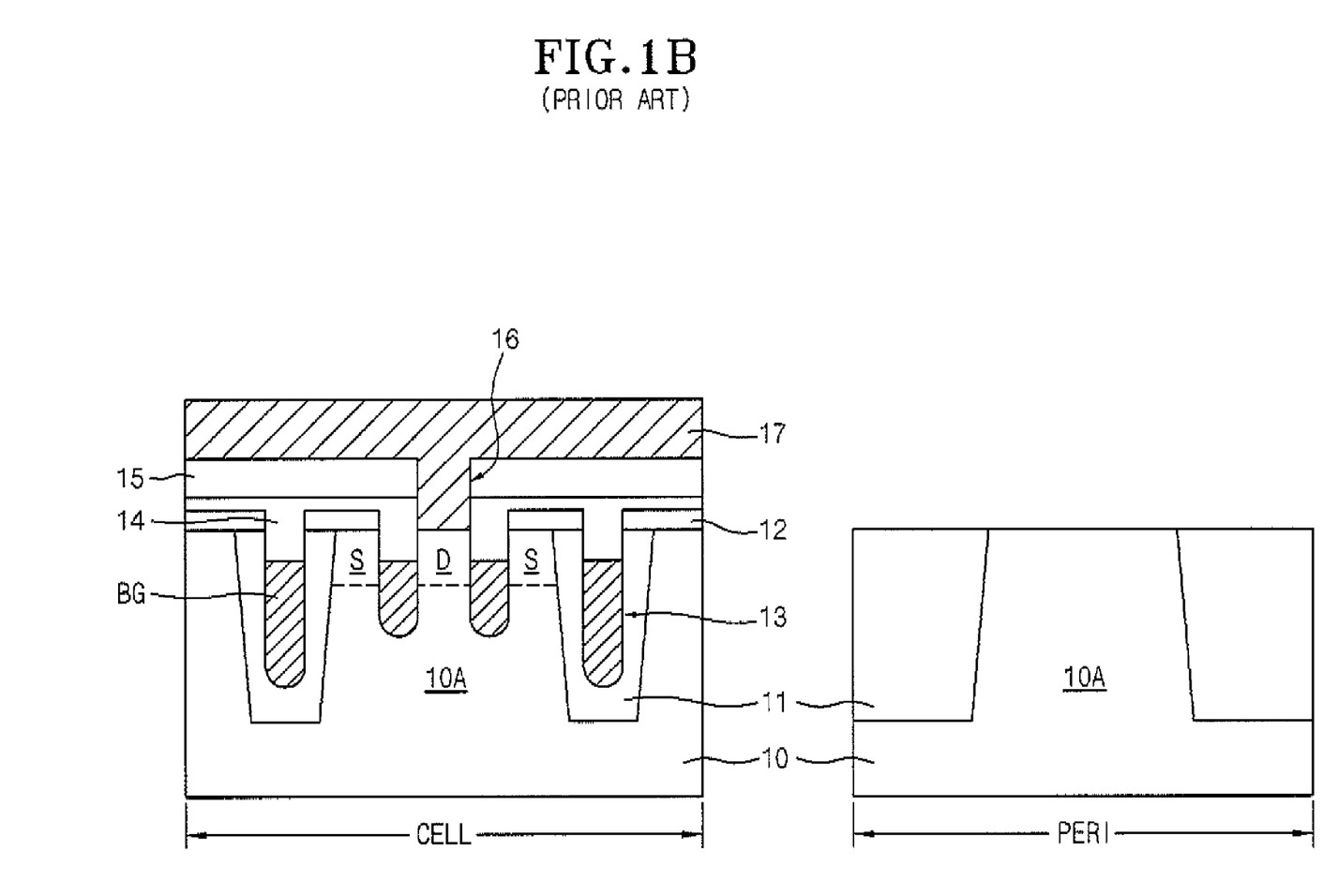

Referring to FIG. 1B, by removing the polysilicon layer 17, the interlayer dielectric 15, the capping layer 14 and the hard mask layer 12 in the peripheral region PERI, the substrate 10 is exposed in the peripheral region PERI.

Figure 1C:
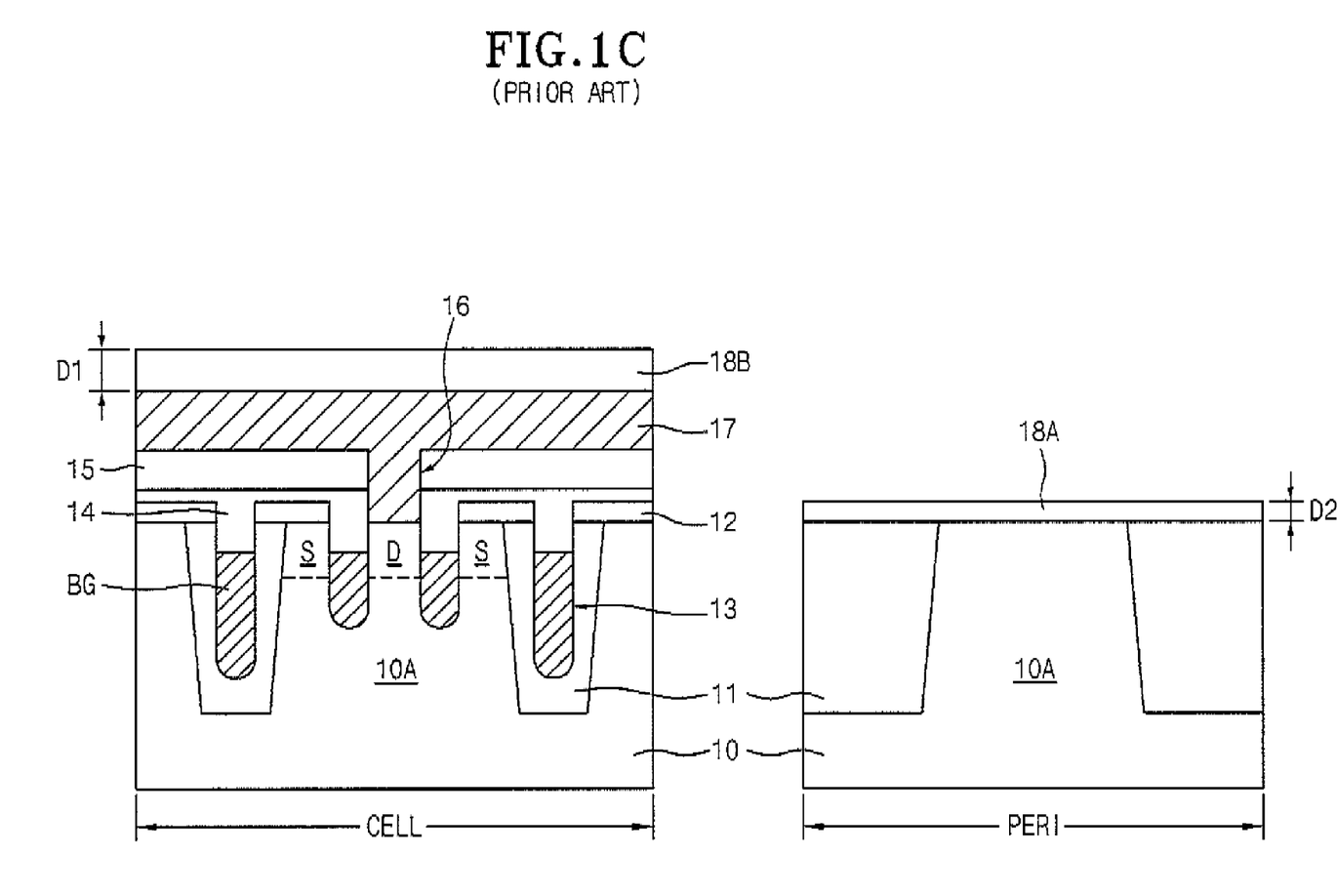

Referring to FIG. 1C, by conducting an oxidation process, a gate oxide layer 18A and an oxide layer 18B are respectively formed on the surface of the substrate 10 in the peripheral region PERI and on the surface of the polysilicon layer 17 in the cell region CELL. In the oxidation process, the surface of the polysilicon layer 17 in the cell region CELL is oxidated, by which the oxide layer 18B is formed on the polysilicon layer 17 in the cell region CELL.

A thickness D1 of the oxide layer 18B, which is formed on the polysilicon layer 17 in the cell region CELL, is proportional to the doping concentration of the polysilicon layer 17. Therefore, for example, the thickness D1 of the oxide layer 18B is at least three times greater than a thickness D2 of the gate oxide layer 18A, which is grown on the substrate 10 in the peripheral region PERI.

Figure 1D:
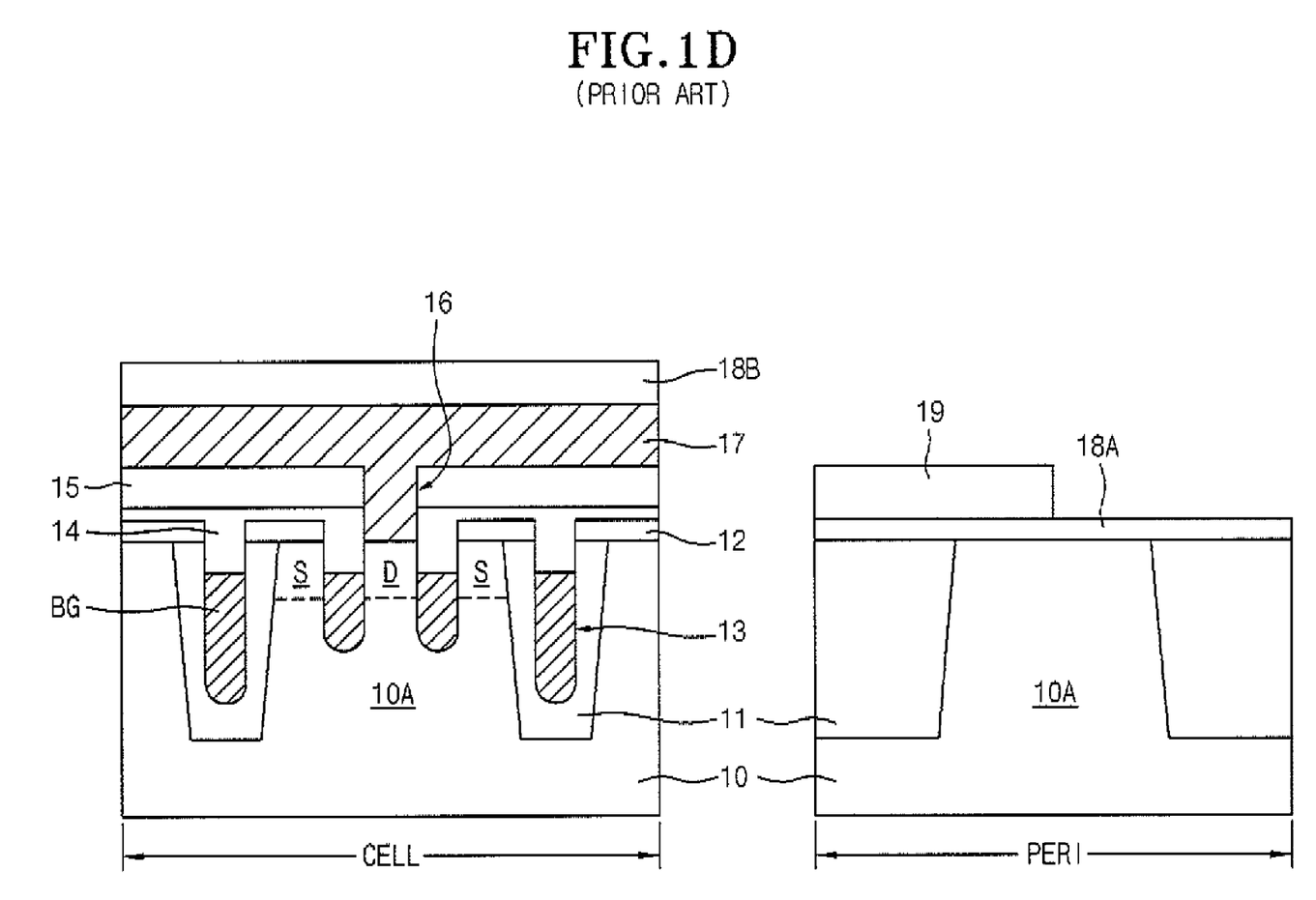

Referring to FIG. 1D, a mask pattern 19 is formed to cover one portion of the peripheral region PERI excluding the cell region CELL.

Figure 1E:
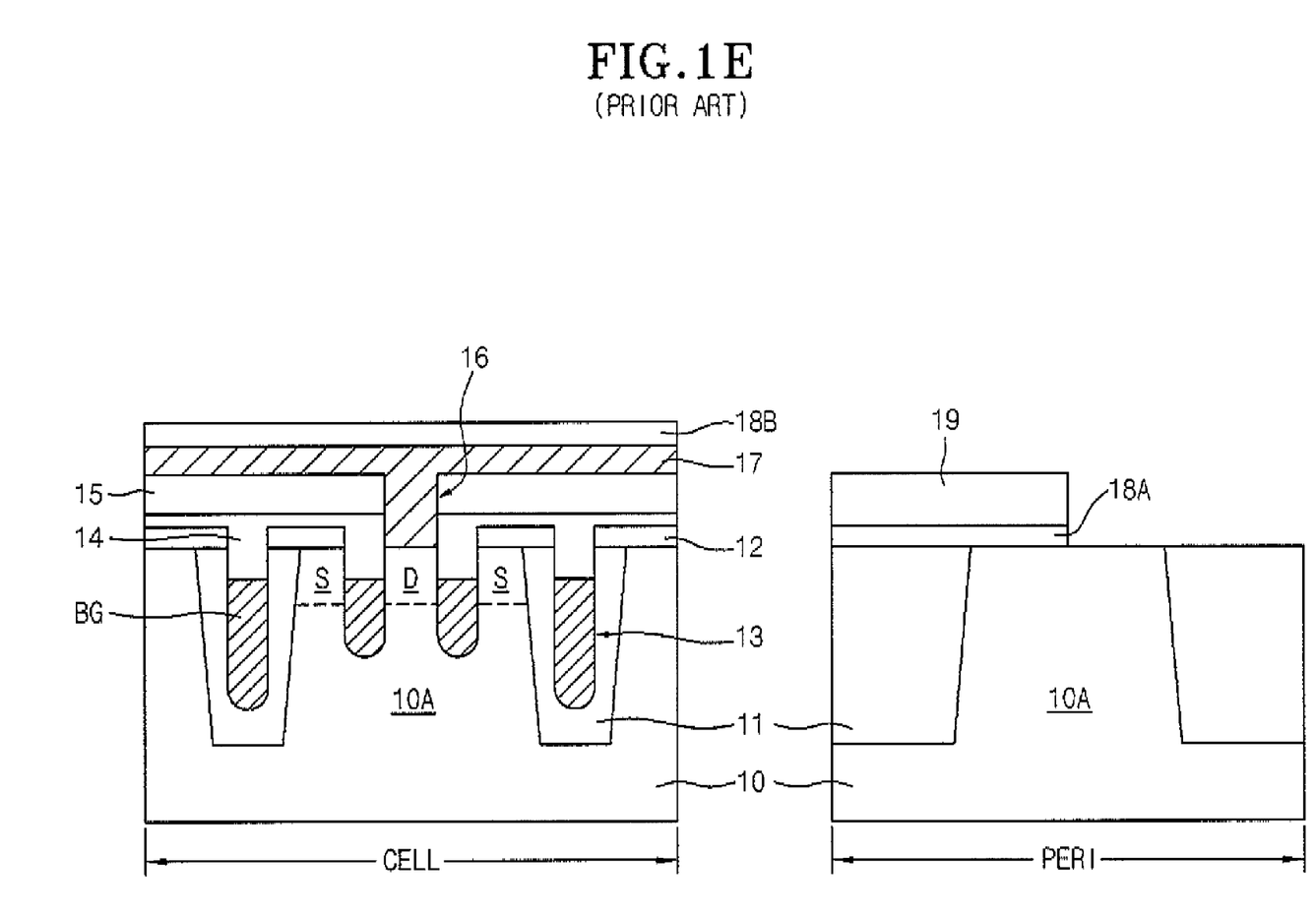

Referring to FIG. 1E, the gate oxide layer 18A, which is exposed by the formation of the mask pattern 19, is removed by using the mask pattern 19 as a barrier.

When removing the gate oxide layer 18A, a partial thickness of the oxide layer 18B in the cell region CELL which is not masked by the mask pattern 19 is also etched.

Since the oxide layer 18B in the cell region CELL is at least three times thicker than the gate oxide layer 18A in the peripheral region PERI as described above, when etching is completed, the oxide layer 18B in the cell region CELL is removed only by the partial thickness. Therefore, the oxide layer 18B remains as a predetermined thickness on the polysilicon layer 17 in the cell region CELL.

Figure 1F:
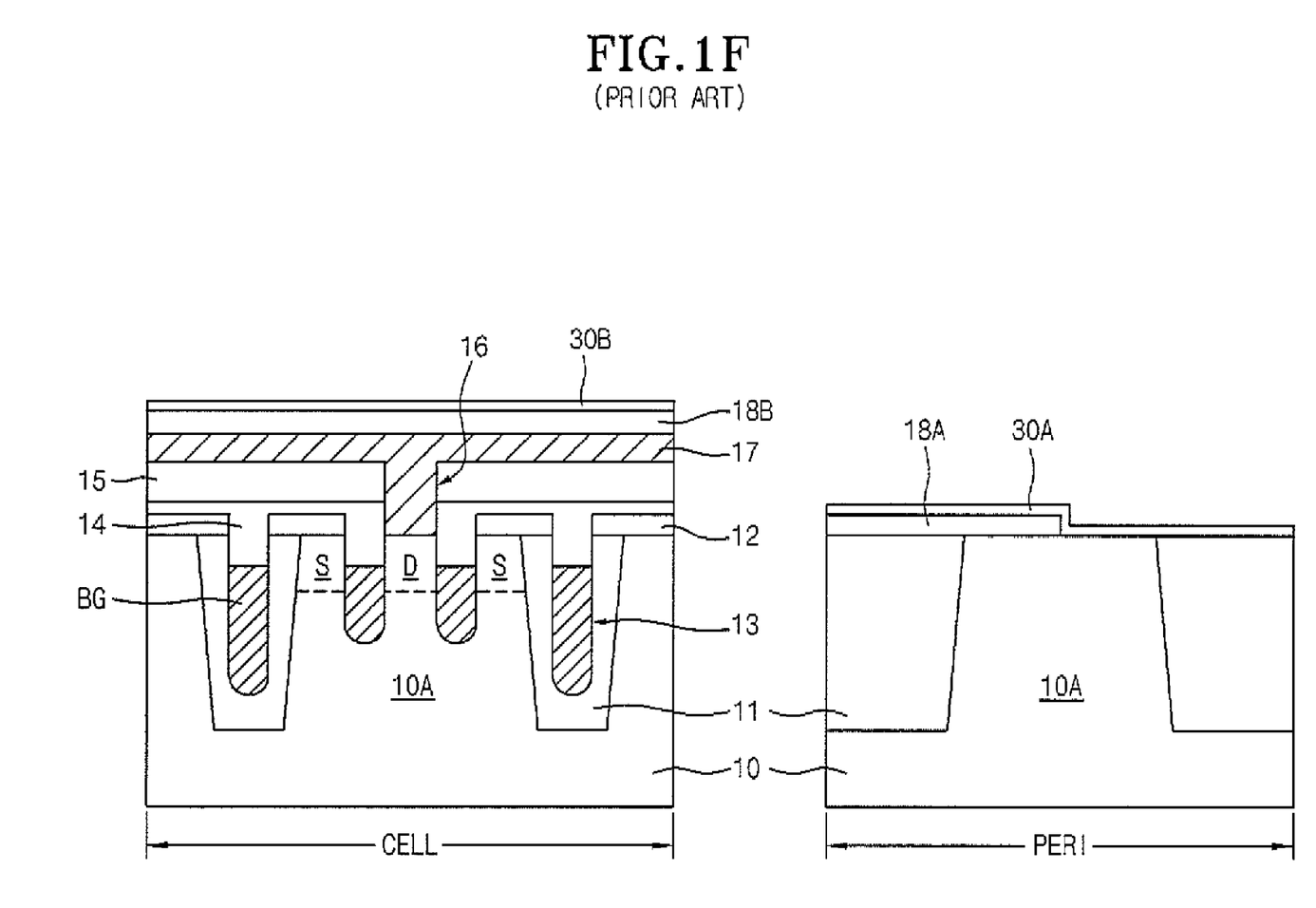

Referring to FIG. 1F, after removing the mask pattern 19 by conducting an oxidation process, a thin gate oxide layer 30A and a thin oxide layer 30B, each having a small thickness, are respectively formed in the peripheral region PERI and the cell region CELL.

As a result of the oxidation process, a thick gate oxide layer having a structure in which the gate oxide layer 18A and the thin gate oxide layer 30A are stacked is formed in the one portion of the peripheral region PERI. A thin gate oxide layer that is constituted only by the thin gate oxide layer 30A is formed in the other portion of the peripheral region PERI. Hence, a gate oxide layer of a dual structure is formed in the peripheral region PERI.

Thereafter, while not shown in a drawing, a gate conductive layer (not shown) is formed in the cell region CELL and the peripheral region PERI, and by conducting a CMP (chemical mechanical polishing) process to expose the interlayer dielectric 15, bit line contacts are formed in the bit line contact holes 16. The gate conductive layer is used as gate electrodes of transistors that are formed in the peripheral region PERI.

However, the above-described conventional method for manufacturing a semiconductor device has the following problems.

The thick oxide layer 18B that is formed on the polysilicon layer 17 in the cell region CELL remains even after the etching process is subsequently completed. Due to the presence of the remaining oxide layer 18B, when subsequently conducting the CMP process to form the bit line contacts, the bit line contacts are likely to be inappropriately separated and adjoining bit line contacts are likely to be short-circuited.

Thus, in order to prevent the bit line contacts from being short-circuited, it is necessary to reduce the thickness of the oxide layer 18B in the cell region CELL before conducting the CMP process for the separation of the bit line contacts. To this end, when conducting the etching process as shown in FIG. 1E, overetching of the oxide layer 18B in the cell region CELL is needed.

In this regard, if the overetching of the oxide layer 18B in the cell region CELL is conducted, the isolation layer 11 in the peripheral region PERI is attacked. As a consequence, problems are caused in that the height of the isolation layer 11 is decreased and the top corner portions of the isolation layer 11 are lost.

As a result, a phenomenon occurs in which the threshold voltage of a semiconductor device formed in the peripheral region PERI is distorted.

SUMMARY OF THE INVENTION

Embodiments of the present invention are directed to a method for manufacturing a semiconductor device that can reduce the thickness of an oxide layer formed on a polysilicon layer for bit line contacts, thereby preventing problems from being caused in subsequent processes.

In an aspect or embodiment of the invention, a method for manufacturing a semiconductor device comprises the steps of forming an interlayer dielectric in a cell region and a peripheral region of a substrate; defining bit line contact holes on the interlayer dielectric in such a way as to expose portions of the substrate in the cell region; filling the bit line contact holes by forming a first polysilcon layer on the interlayer dielectric; forming a second polysilicon layer on the first polysilicon layer, the second polysilicon layer having a slower oxidation speed than the first polysilicon layer; removing the second polysilicon layer, the first polysilicon layer and the interlayer dielectric that are formed in the peripheral region; and oxidating the second polysilicon layer formed in the cell region and a surface of the substrate in the peripheral region, thereby forming an oxide layer in the cell region and a gate oxide layer on the surface of the substrate in the peripheral region.

In another aspect or embodiment of the invention, the first polysilicon layer may be formed as a doped polysilicon layer.

In yet another aspect or embodiment of the invention, the second polysilicon layer may be formed as a doped polysilicon layer that is doped at a lower concentration than the first polysilicon layer.

In a further aspect or embodiment of the invention, the second polysilicon layer may be formed as an undoped polysilicon layer.

In another aspect or embodiment of the invention, the second polysilicon layer may be formed as a crystalline polysilicon layer.

In still another aspect or embodiment of the invention, the crystalline polysilicon layer may be formed at a temperature of 550 to 800° C.

In another aspect or embodiment of the invention, the crystalline polysilicon layer may be formed by depositing an amorphous polysilicon layer and crystallizing the amorphous polysilicon layer.

In a further aspect or embodiment of the invention, the amorphous polysilicon layer may be crystallized through an annealing process conducted at a temperature of 600-1,100° C.

In another aspect or embodiment of the invention, after the step of forming the oxide layer in the cell region and the gate oxide layer in the peripheral region, the method further may comprise the steps of conducting at least one time, a unit cycle process comprising forming a mask pattern which covers one portion of the peripheral region; removing the oxide layer in the cell region and the other portion of the gate oxide layer in the peripheral region by using the mask pattern as a barrier; removing the mask pattern; forming a thin oxide layer on the first polysilicon layer in the cell region from which the oxide layer is removed; and forming a thin gate oxide layer on one portion of the gate oxide layer which remains on the substrate in the peripheral region due to removal of the other portion of the gate oxide layer and on the surface of the substrate exposed in the peripheral region.

In still another aspect or embodiment of the invention, after the step of repeatedly conducting the unit cycle process, the method further may comprise the steps of forming a conductive layer for gates on the thin oxide layer in the cell region and the thin gate oxide layer in the peripheral region; and entire-surface etching the conductive layer for gates and the first polysilicon layer in the cell region in such a way as to expose the interlayer dielectric, thereby forming bit line contacts in the cell region.

In another aspect or embodiment of the invention, the second polysilicon layer may be formed to a thickness that is one half to one time the thickness of the gate oxide layer.

DETAILED DESCRIPTION OF THE PREFERRED EMBODIMENTS

As required, detailed embodiments of the present invention are disclosed herein. However, it is to be understood that the disclosed embodiments are merely exemplary of the invention, which may be embodied in various forms. Therefore, specific details disclosed herein are not to be interpreted as limiting, but merely as a basis for the claims and as a representative basis for teaching one skilled in the art to variously employ the present invention in virtually any appropriate manner.

In the present approach, the thickness of an oxide layer formed on a polysilicon layer for bit line contacts is reduced. Through this, in the present approach, it is possible to prevent the occurrence of a short-circuit between adjoining bit lines due to the oxide layer.

In the present approach, due to the fact that the thickness of the oxide layer is reduced, it is not necessary to conduct overetching in a subsequent etching process. Accordingly, in the present approach, it is possible to prevent defects from being caused by the loss of an isolation layer in a peripheral region due to the overetching.

Hereafter, specific aspects or embodiments of the present invention will be described in detail with reference to the accompanying drawings.

It is understood herein that the drawings are not necessarily to scale and in some instances proportions may have been exaggerated in order to more clearly depict certain features of the invention.

FIGS. 2A through 2F are cross-sectional views explaining a method for manufacturing a semiconductor device in accordance with aspects or embodiments of the present invention.

Figure 2A:
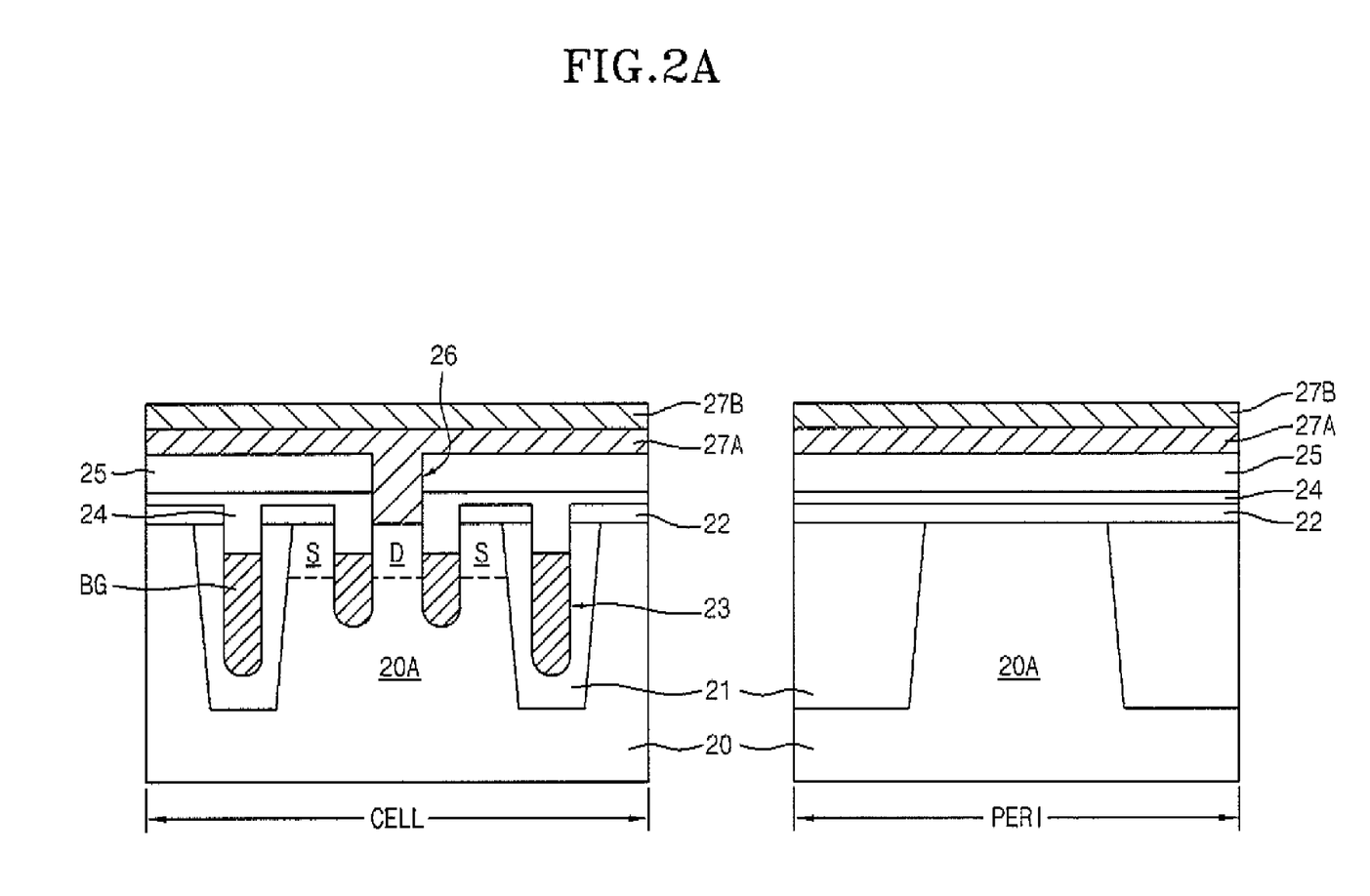
FIGS. 2A through 2F are cross-sectional views explaining a method for manufacturing a semiconductor device in accordance with aspects or embodiments of the present invention.

Referring to FIG. 2A, an isolation layer 21 is formed in a cell region CELL and a peripheral region PERI of a substrate 20 in such a way as to delimit active regions 20A. A hard mask layer 22 is formed in the cell region CELL and the peripheral region PERI. Trenches 23 are defined by sequentially etching the hard mask layer 22, the isolation layer 21 and the substrate 20 at gate forming zones in the cell region CELL. The hard mask layer 22 can be formed as a nitride layer or a stack of an oxide layer and a nitride layer, for example.

Then, after forming buried type gates BG in the lower portions of the trenches 23, sources S and drains D are formed in the active regions 20A on both sides of the trenches 23.

Although not shown and explained in detail, the buried type gates BG can be formed by forming a gate insulation layer along a surface profile on the substrate 20 including the trenches 23, forming a metal layer on the gate insulation layer to fill the trenches 23, and entire-surface etching the metal layer and the gate insulation layer, for example.

Next, a capping layer 24 is formed in the cell region CELL and the peripheral region PERI to fill the trenches 23, and an interlayer dielectric 25 is formed on the capping layer 24. The capping layer 24 is formed to prevent oxidation of the metal layer used to form the buried type gates BG, and can comprise a nitride layer, for example.

After forming the capping layer 24 and before forming the interlayer dielectric 25, a planarization process for planarizing the surface of the capping layer 24 can be conducted.

Bit line contact holes 26 are defined by patterning the interlayer dielectric 25, the capping layer 24 and the hard mask layer 22 in the cell region CELL in such a way as to expose the drains D that constitute portions of the substrate 20 in the cell region CELL. A first polysilicon layer 27A is formed on the entire surface, including the bit line contact holes 26, in order to fill the bit line contact holes 26.

The first polysilicon layer 27A is formed to be used as bit line contacts that electrically connect bit lines (not shown) and the drains D. The first polysilicon layer 27A is formed as a heavily doped polysilicon layer so as to reduce the resistance of the bit line contacts that will be subsequently formed. The heavily doped polysilicon layer contains, for example, phosphorus (P).

Thereafter, a second polysilicon layer 27B, which has an oxidation speed slower than that of the first polysilicon layer 27A, is formed on the first polysilicon layer 27A. The second polysilicon layer 27B can be formed as a doped polysilicon layer, which is doped at a lower concentration than the first polysilicon layer 27A, or as an undoped polysilicon layer, for example. The undoped polysilicon layer can be formed to have a crystalline phase or an amorphous phase, for example.

Hereafter, the undoped polysilicon layer formed to have a crystalline phase will be referred to as a crystalline polysilicon layer.

The undoped polysilicon layer, as the crystalline polysilicon layer, is formed by conducting deposition, for example, at a high temperature of 550 to 800° C., preferably, at a high temperature of 550 to 700° C.

Also, the crystalline polysilicon layer can be formed by is depositing an amorphous polysilicon layer at a low temperature and crystallizing the amorphous polysilicon layer through conducting a subsequent annealing process at a temperature of, for example, 600 to 1,100° C.

If the thickness of the second polysilicon layer 27B is large, zo the thickness of the first polysilicon layer 27A is small, whereby conductivity is degraded. If the thickness of the second polysilicon layer 27B is small, when subsequently conducting an oxidation process, not only the second polysilicon layer 27B but also the underlying first polysilicon layer 27A having a faster oxidation speed are oxidized, by which the thickness of an oxide layer 28B (see FIG. 2C) increases.

Therefore, the thickness of the second polysilicon layer 27B is set to be in a range that can suppress the degradation of conductivity and minimize the thickness of the oxide layer 28B that is formed in the cell region CELL. For example, the thickness of the second polysilicon layer 27B can be set to one half to one times the thickness of a gate oxide layer 28A (see FIG. 3C) that is formed in the peripheral region PERI.

Figure 2B:
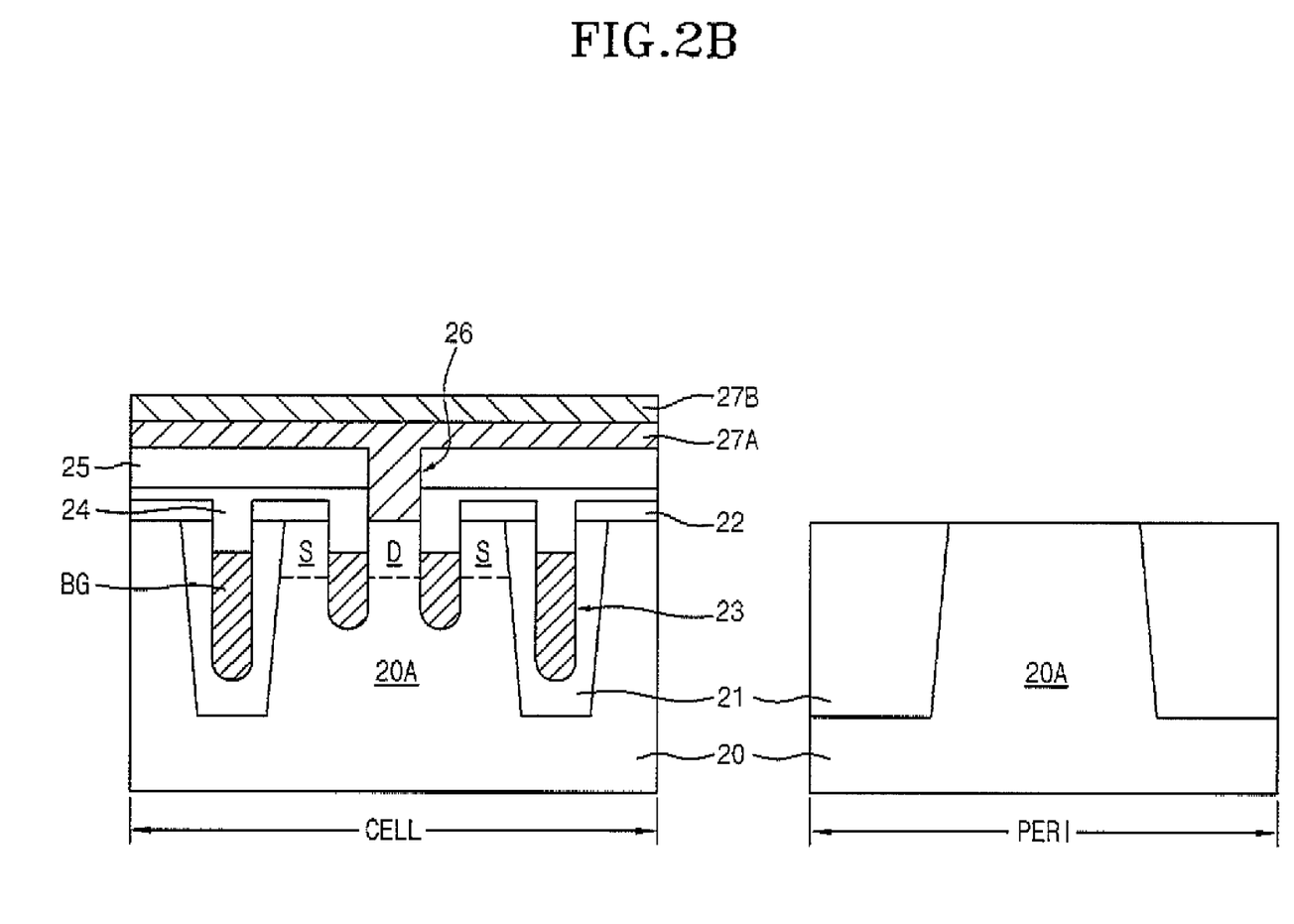
Figure 2C:
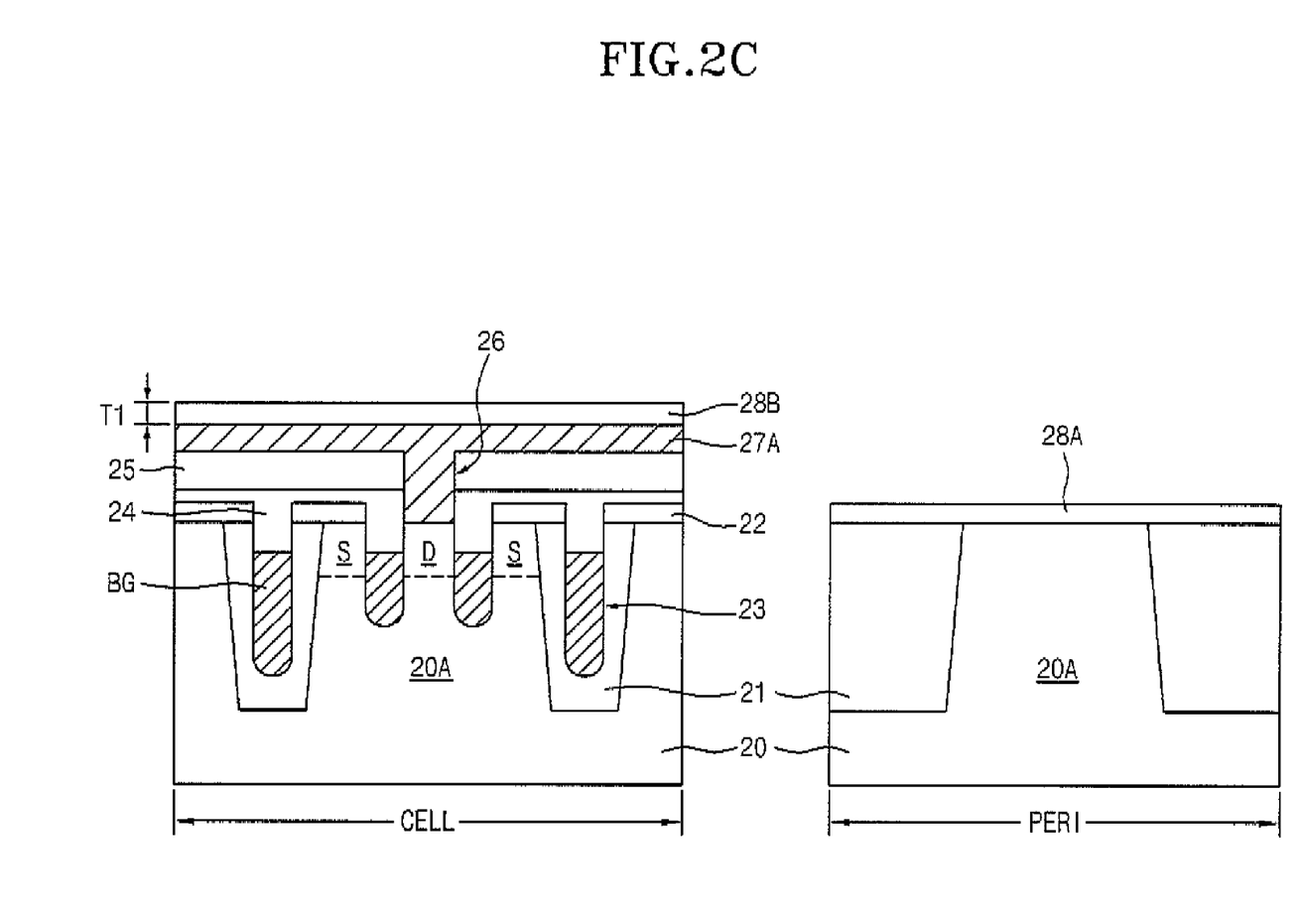

Referring to FIG. 2B, the substrate 20 is exposed in the peripheral region PERI by removing the second and first polysilicon layers 27B and 27A, the interlayer dielectric 25, the capping layer 24 and the hard mask layer 22 in the peripheral region PERI.

Referring to FIG. 2C, by conducting an oxidation process on the surface of the substrate 20 in the peripheral region PERI, the gate oxide layer 28A is formed in the peripheral region PERI. During the oxidation process, the second polysilicon layer 27B in the cell region CELL is oxidated, by which the oxide layer 28B is formed in the cell region CELL.

Here, because the second polysilicon layer 27B has an oxidation speed slower than the first polysilicon layer 27A, a thickness T1 of the oxide layer 28B formed in the cell region CELL is decreased in comparison with the conventional art.

Figure 2D:
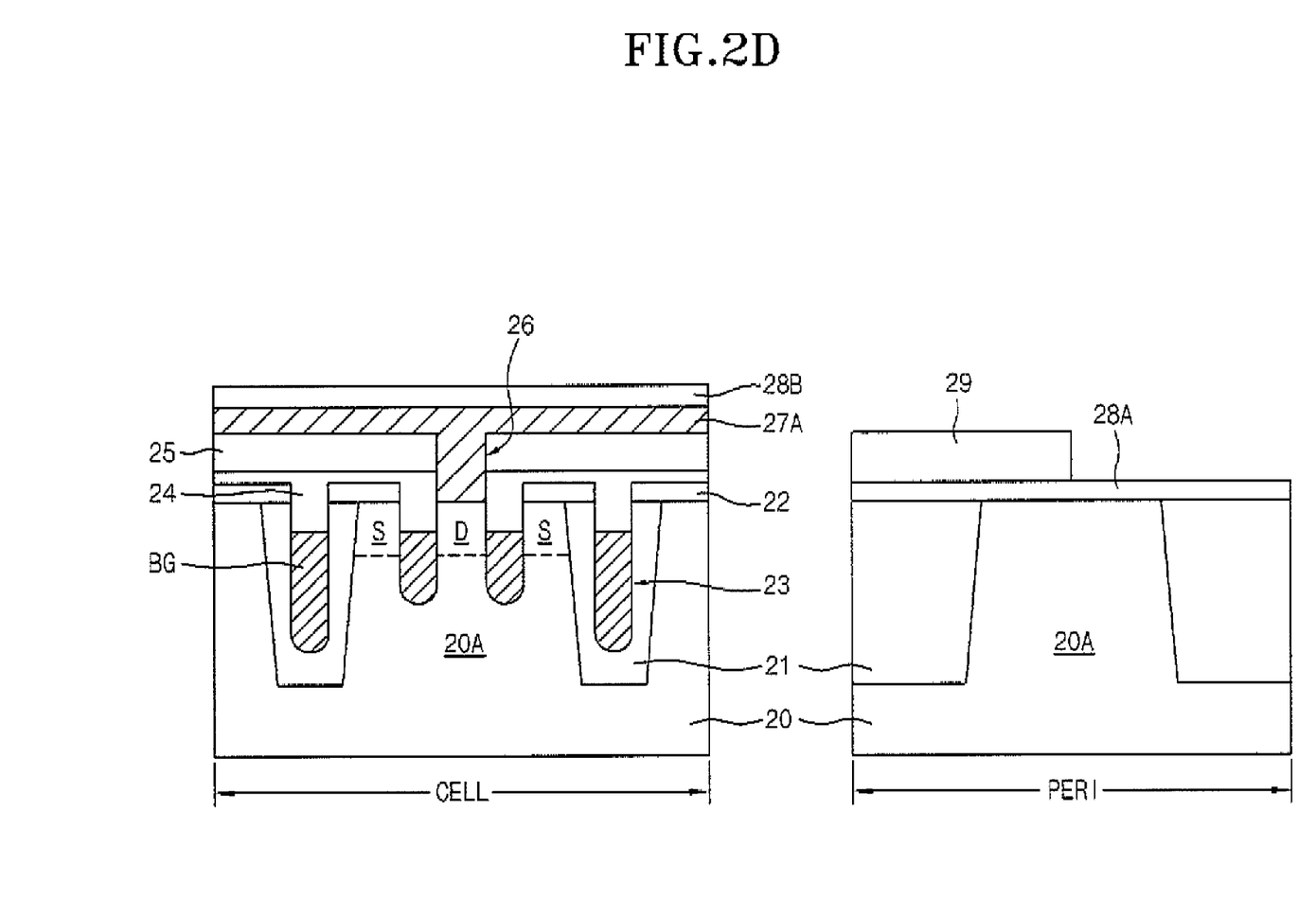

Referring to FIG. 2D, a mask pattern 29 is formed to cover one portion of the peripheral region PERI.

Figure 2E:
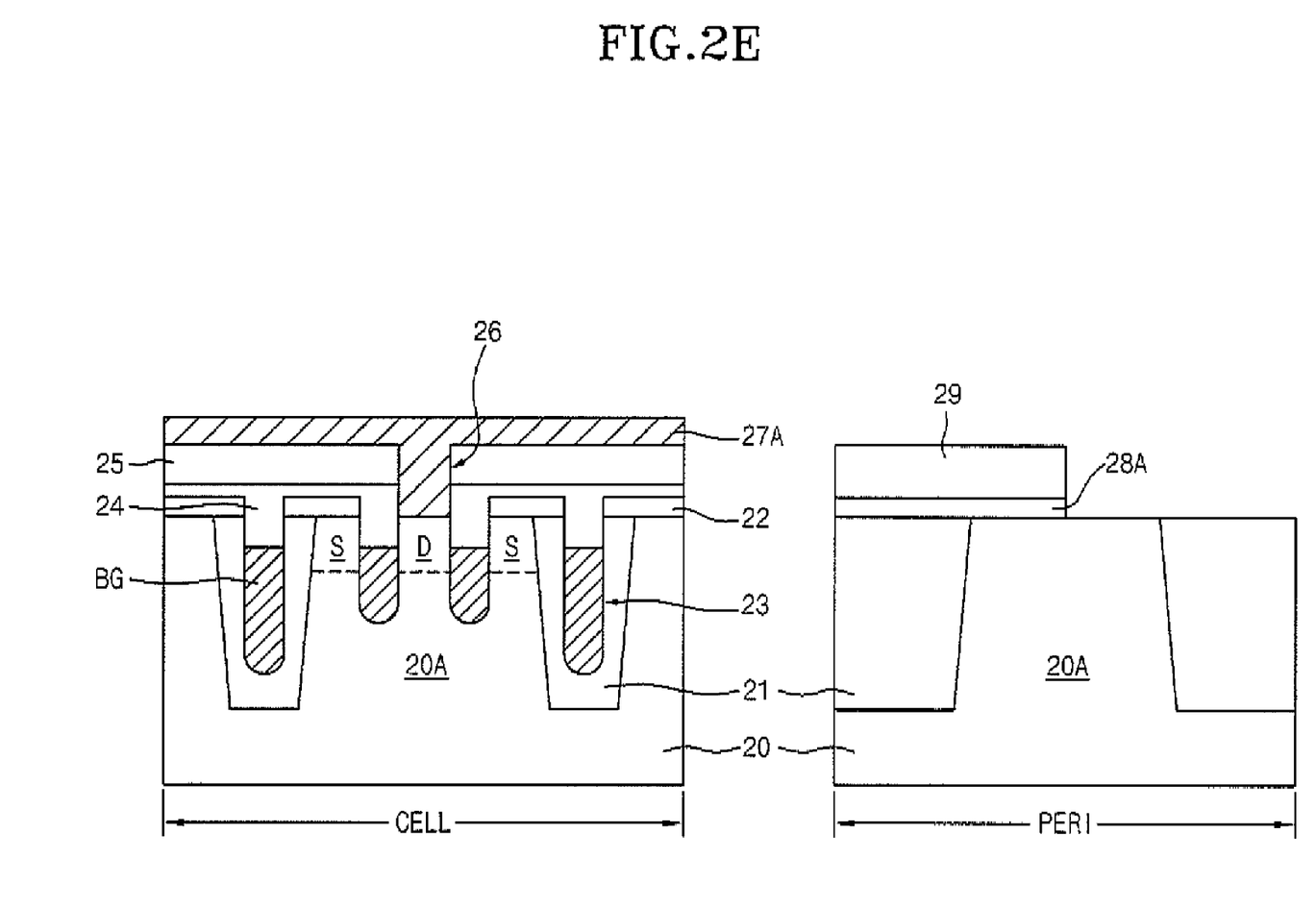

Referring to FIG. 2E, the oxide layer 28B exposed in the cell region CELL and the other portion of the gate oxide layer 28A exposed in the peripheral region PERI are removed by conducting an etching process using the mask pattern 29 as a barrier. As the etching process, a wet etching process or a dry etching process can be used, for example. Since the thickness of the oxide layer 28B in the cell region CELL is not large in comparison with the conventional art, almost all of the oxide layer 28B in the cell region CELL is removed through the etching process.

Figure 2F:
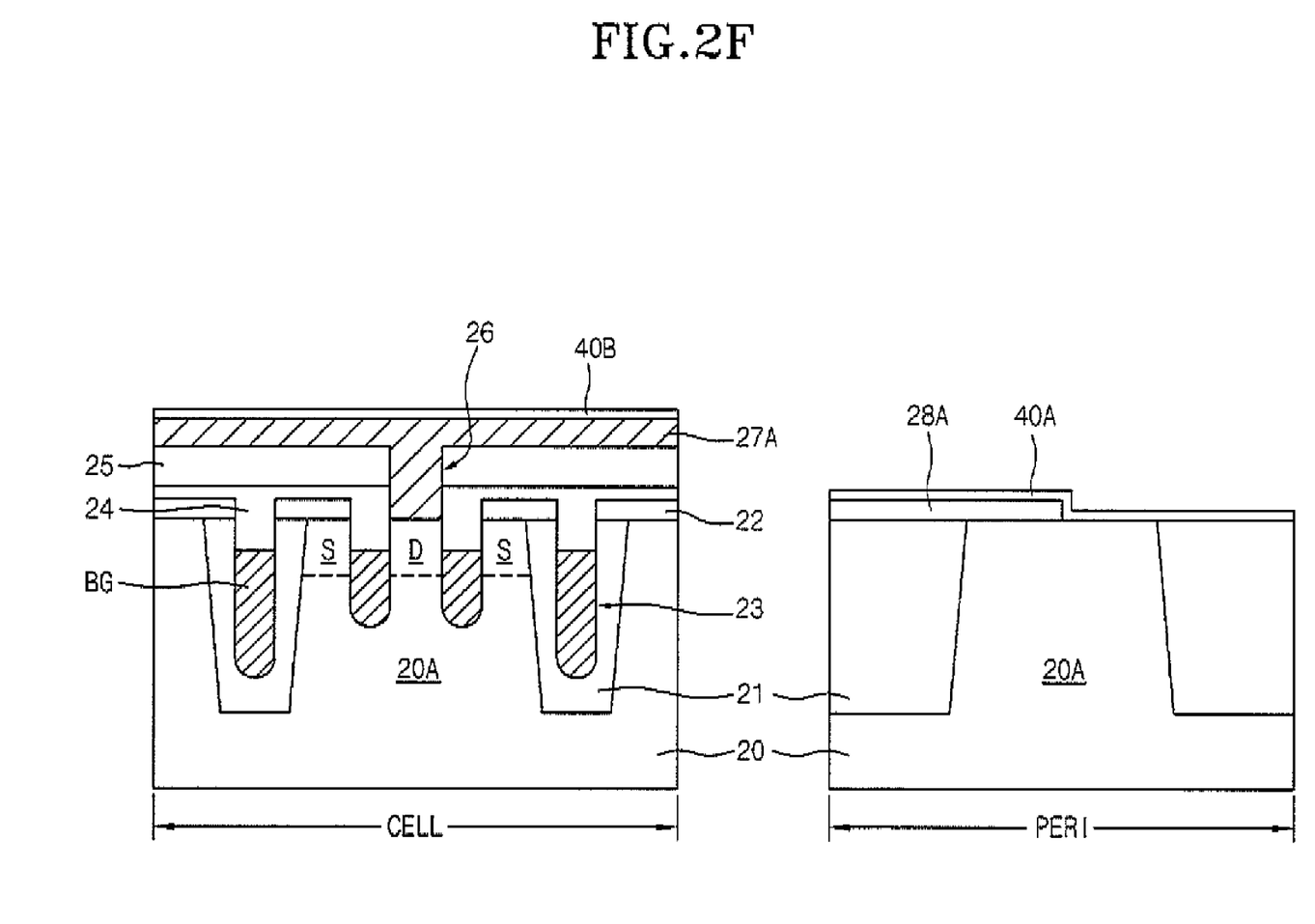

Referring to FIG. 2F, the mask pattern 29 is removed. Then, a thin gate oxide layer 40A and a thin oxide layer 40B are respectively formed on one portion of the gate oxide layer 28A that remains on the substrate 20 in the peripheral region PERI due to removal of the other portion of the gate oxide layer 28A and the surface of the substrate 20 exposed in the peripheral region PERI, and on the first polysilicon layer 27A in the cell region CELL from which the oxide layer 28B is removed.

Resultantly, a thick gate oxide layer which is composed of the gate oxide layer 28A and the thin gate oxide layer 40A is formed on the one portion of the peripheral region PERI, and a thin gate oxide layer which is composed of the thin gate oxide layer 40A is formed on the other portion of the peripheral region PERI. That is to say, a gate oxide layer of a dual structure is formed in the peripheral region PERI.

While it is illustrated in the embodiment shown in the drawings that the gate oxide layer in the peripheral region PERI is formed to have the dual structure, the gate oxide layer in the peripheral region PERI can be formed to be composed of three or more layers, for example.

To this end, the step of forming the gate oxide layer 28A, the step of forming the mask pattern 29, the step of removing the exposed portion of the gate oxide layer 28A using the mask pattern 29 as a barrier, and the step of removing the mask pattern 29 can be implemented at least two times while alternately changing an area opened by the mask pattern 29. Then, the surface of the thin gate oxide layer 40A can be nitridated through a plasma nitridation process.

Thereupon, a conductive layer (not shown) for gate electrodes, which is to be used as gate electrodes in the peripheral region PERI, is formed in the cell region CELL and the peripheral region PERI. Then, by conducting an entire-surface etching process for the conductive layer for gate electrodes and the first polysilicon layer 27A in such a way as to expose the interlayer dielectric 25, bit line contacts are formed to be isolated in the bit line contact holes 26 in the cell region CELL. As the entire-surface etching process, an etch-back process or a CMP process can be employed, for example.

At this time, only the thin oxide layer 40B exists between the first polysilicon layer 27A and the conductive layer for gate electrodes in the cell region CELL. Since the thickness of the thin oxide layer 40B is small, the influence exerted on the entire-surface etching process by the thin oxide layer 40B is negligibly insignificant. Therefore, when conducting the entire-surface etching process, it is possible to prevent defects from occurring due to non-separation of the bit line contacts.

As is apparent from the above description, in the present invention, the thickness of an oxide layer which is grown on a polysilicon layer for bit line contacts is reduced. As a consequence, problems caused in subsequent processes due to the presence of a thick oxide layer on the polysilicon layer for bit line contacts, that is, the occurrence of a short-circuit between bit line contacts and the loss of an isolation layer in a peripheral region can be prevented.

Although aspects and embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming an interlayer dielectric in a cell region and a peripheral region of a substrate;
    defining bit line contact holes on the interlayer dielectric in such a way as to expose portions of the substrate in the cell region;
    filling the bit line contact holes by forming a first polysilicon layer on the interlayer dielectric;
    forming a second polysilicon layer on the first polysilicon layer, the second polysilicon layer having a slower oxidation speed than the first polysilicon layer;
    removing the second polysilicon layer, the first polysilicon is layer and the interlayer dielectric that are formed in the peripheral region; and
    oxidating the second polysilicon layer formed in the cell region and a surface of the substrate in the peripheral region, thereby forming an oxide layer in the cell region and a gate oxide layer on the surface of the substrate in the peripheral region.

2. The method according to claim 1, wherein the first polysilicon layer is formed as a doped polysilicon layer.

3. The method according to claim 1, wherein the second polysilicon layer is formed as a doped polysilicon layer that is doped at a lower concentration than the first polysilicon layer.

4. The method according to claim 1, wherein the second polysilicon layer is formed as an undoped polysilicon layer.

5. The method according to claim 4, wherein the second polysilicon layer is formed as a crystalline polysilicon layer.

6. The method according to claim 5, wherein the crystalline polysilicon layer is formed at a temperature of 550 to 800° C.

7. The method according to claim 5, wherein the crystalline polysilicon layer is formed by depositing an amorphous polysilicon layer and crystallizing the amorphous polysilicon layer.

8. The method according to claim 7, wherein the amorphous polysilicon layer is crystallized through an annealing process conducted at a temperature of 600 to 1,100° C.

9. The method according to claim 1, further comprising the steps of:
    conducting at least one time, a unit cycle process comprising:
        forming a mask pattern that covers one portion of the peripheral region;
        removing the oxide layer in the cell region and the other portion of the gate oxide layer in the peripheral region by using the mask pattern as a barrier;
        removing the mask pattern;
        forming a thin oxide layer on the first polysilicon layer in the cell region from which the oxide layer is removed; and
        forming a thin gate oxide layer on one portion of the gate oxide layer that remains on the substrate in the peripheral region due to removal of the other portion of the gate oxide layer, and on the surface of the substrate exposed in the peripheral region.

10. The method according to claim 9, wherein the unit cycle process is repeated at least one time.

11. The method according to claim 10, wherein, after the step of repeatedly conducting the unit cycle process, the method further comprising the steps of:
    forming a conductive layer for gates on the thin oxide layer in the cell region and the thin gate oxide layer in the peripheral is region; and
    etching the conductive layer for gates and the first polysilicon layer in the cell region to expose the interlayer dielectric, thereby forming bit line contacts in the cell region.

12. The method according to claim 1, wherein the second polysilicon layer is formed to a thickness that is one half to one times the thickness of the gate oxide layer.

* * * * *